(12) United States Patent
Ku et al.

(10) Patent No.: US 7,140,837 B2
(45) Date of Patent: Nov. 28, 2006

(54) FAN GUARD

(75) Inventors: Chin-Long Ku, Tu-Cheng (TW); Chin-Wen Yeh, Tu-Cheng (TW)

(73) Assignee: Hon Hai Precision Industry Co., Ltd. (TW)

( * ) Notice: Subject to any disclaimer, the term of this patent is extended or adjusted under 35 U.S.C. 154(b) by 142 days.

(21) Appl. No.: 10/953,096

(22) Filed: Sep. 29, 2004

(65) Prior Publication Data

US 2005/0232754 A1    Oct. 20, 2005

(30) Foreign Application Priority Data

Apr. 17, 2004    (CN) .................. 2004 2 0045006

(51) Int. Cl.
*F04D 29/40*    (2006.01)

(52) U.S. Cl. .............. 415/121.2; 415/213.1; 415/214.1

(58) Field of Classification Search ............. 415/214.1, 415/121.2, 211.2, 213.1
See application file for complete search history.

(56) References Cited

U.S. PATENT DOCUMENTS

| | | | | |
|---|---|---|---|---|
| 3,449,605 | A * | 6/1969 | Wilson | 310/58 |
| 4,682,065 | A * | 7/1987 | English et al. | 310/90 |
| 6,612,817 | B1 * | 9/2003 | Lin et al. | 417/423.5 |
| 6,713,907 | B1 * | 3/2004 | Matsumoto | 310/67 R |
| 6,926,497 | B1 * | 8/2005 | Lin et al. | 415/213.1 |

FOREIGN PATENT DOCUMENTS

TW            578947            3/1994

* cited by examiner

*Primary Examiner*—Ninh H. Nguyen
(74) *Attorney, Agent, or Firm*—Morris Manning & Martin; Tim Tingkang Xia, Esq.

(57) ABSTRACT

A fan guard includes a frame, a bracket connected with the frame and a bearing seat connected with the bracket. A detachable interlocking device is formed between at least one of the combinations of the frame and the bracket, and of the bracket and the bearing seat.

19 Claims, 5 Drawing Sheets

FAN GUARD

TECHNICAL FIELD

The present invention relates to a fan, and particularly to a fan guard easily to be assembled and disassembled.

BACKGROUND

Fans are widely used in many systems which generate heat and have a need of keeping the systems in their working status within a range of normal working temperature. Oftentimes, fans are mounted to systems via fan guards.

A conventional fan guard includes a bearing seat, a tube disposed on the seat, a frame around the seat and a plurality of ribs connecting the seat to the frame. The base, the tube, the frame and the ribs are integrally molded. An example of this type of structure is disclosed in Taiwan Patent Publication No. 578947. However, this type of structure has many disadvantages. As developing of the fans, some parts of the fan guards of the fans need especial performance to fit special requirements of the fan. For example, the tube requires higher strength while the frame has no such special requirement. For meeting the demand of the higher strength, the whole integrated fan guard must be made of the same material having higher strength. This results in the raising of the cost of the fan guard. When some parts of the fan guard are damaged and need to be replaced, the fan guard must be replaced as a whole due to the integrity of the fan guard. The lifespan of the fan guard is therefore reduced.

A new fan guard that overcomes the above-mentioned disadvantages is desired.

SUMMARY OF THE INVENTION

Accordingly, an object of the present invention is to provide a fan guard with low cost and long lifespan.

To achieve the above-mentioned object, a fan guard in accordance with the present invention comprises a frame, a bracket connected with the frame and a bearing seat connected with the bracket. A detachable interlocking device is formed between at least one of the combinations of the frame and the bracket, and of the bracket and the bearing seat.

Other objects, advantages and novel features of the present invention will be drawn from the following detailed description of the preferred embodiments of the present invention with attached drawings, in which:

DETAILED DESCRIPTION OF PREFERRED EMBODIMENTS

Figure 1:
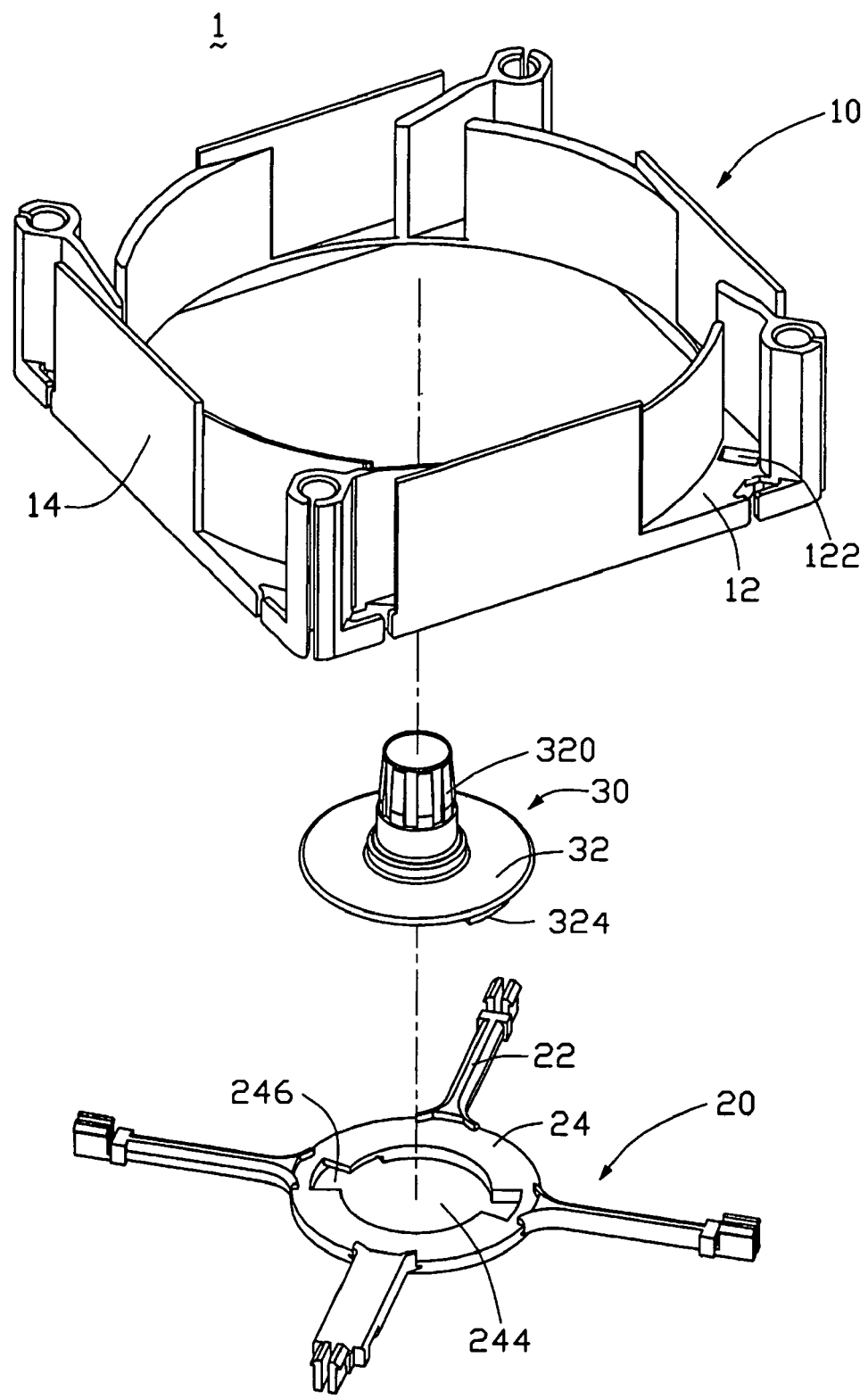
FIG. 1 is an exploded, isometric view of a fan guard in accordance with the preferred embodiment of the present invention.
Figure 2:
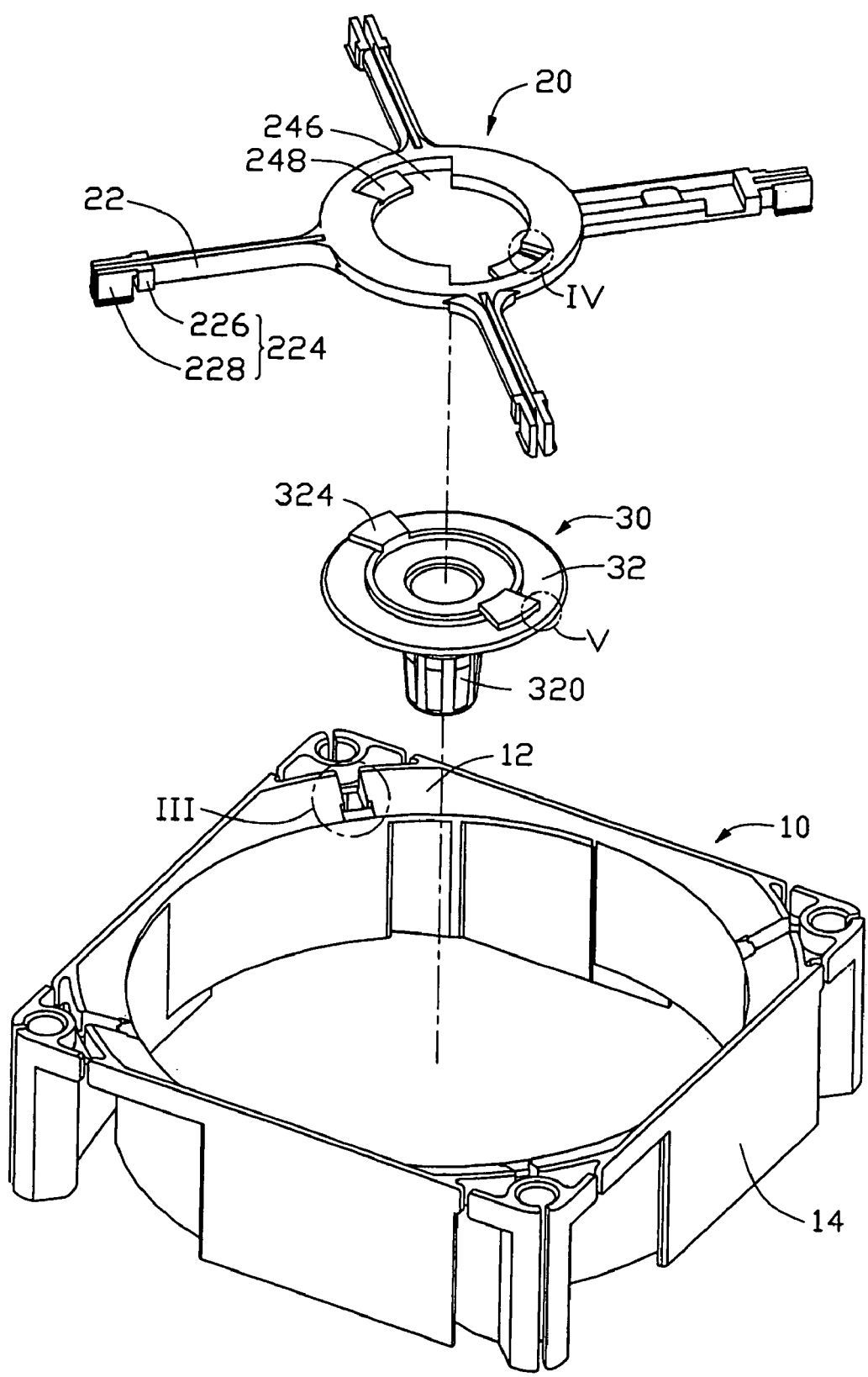
FIG. 2 is an exploded, isometric view of a fan guard viewed from another aspect.

Referring to FIG. 1 and FIG. 2, a fan guard 1 includes a rectangular frame 10, a bracket 20 connected with the frame 10, and a bearing seat 30 used as a part complementary installer and connected with the bracket 20.

Figure 3:
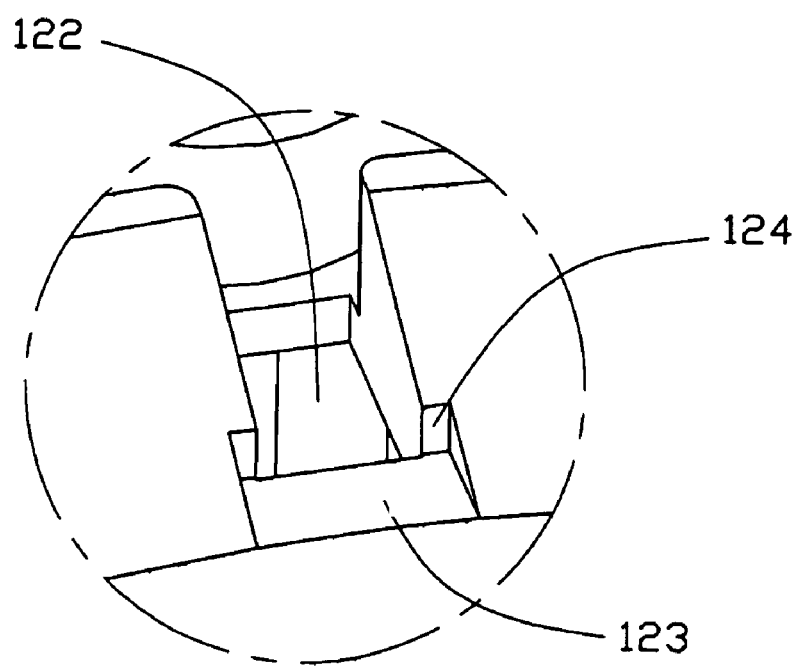
FIG. 3 is an enlarged view of a circled part III in FIG. 2.

The frame 10 is molded from plastic material, and comprises a base 12 defining an opening (not labeled) as a receiving space therein, and four vertical sidewalls 14 extending upwardly from the base 12 and surrounding the opening. An aperture 122 and a chamber 123 (shown in FIG. 3) communicating with the aperture 122 are defined at each corner of the base 12. A pair of stop walls 124 (shown in FIG. 3) is formed between the aperture 122 and the chamber 123 on opposite sides of the aperture 122.

Figure 4:
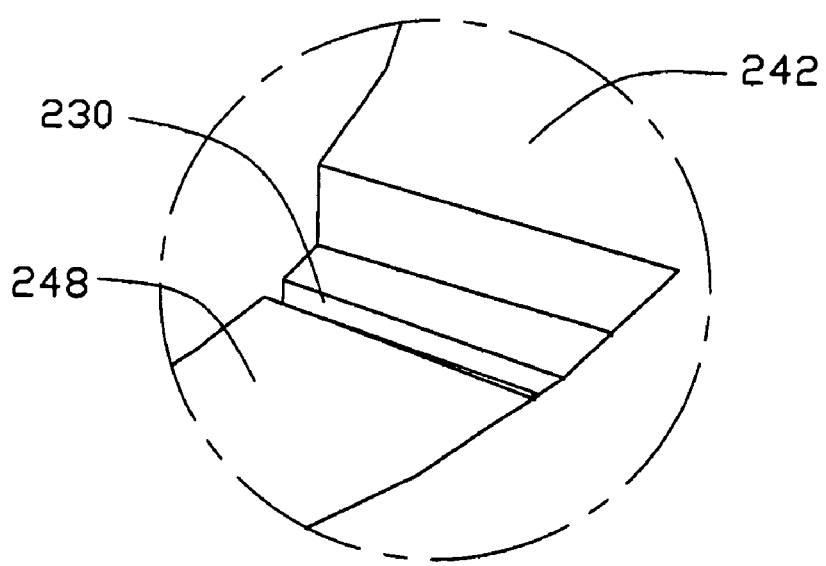
FIG. 4 is an enlarged view of a circled part IV in FIG. 2.

The bracket 20 comprises a chassis 24 and four ribs 22 of which every two adjacent ribs 22 are substantially perpendicular to each other. A hole 244 and a pair of cutouts 246 communicating with the hole 244 are defined in the chassis 24. A pair of recesses 248 communicating with the cutouts 246 is defined in an underside of the chassis 24. A slot 230 (shown in FIG. 4) is defined at the recess 248. A lock portion 224 is formed at the end of each rib 22. The lock portion 224 comprises a nub 226 corresponding to the chamber 123 of the base 12 and a pair of hooks 228 corresponding to the aperture 122. The combination of the lock portions 224, the apertures 122 and the chambers 123 acts as a first interlocking device to provide a detachable connection between the bracket 20 and the frame 10.

Figure 5:
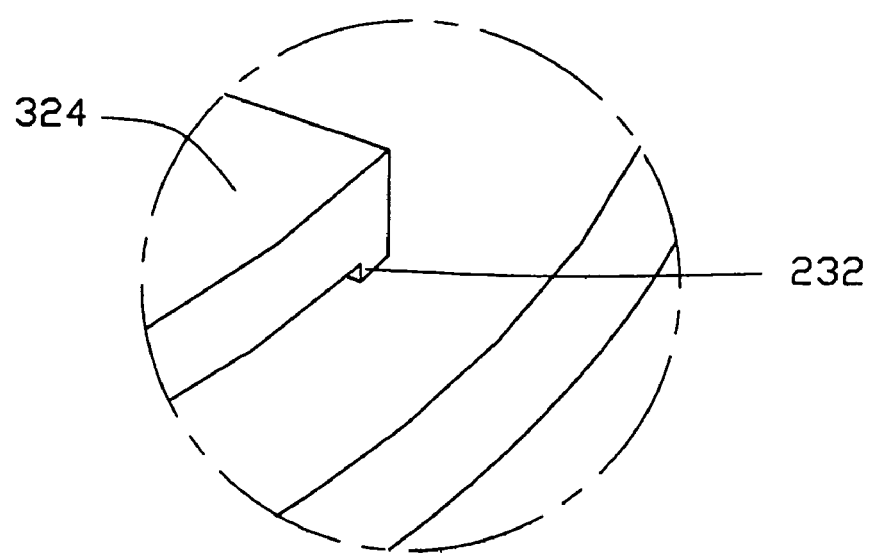
FIG. 5 is an enlarged view of a circled part V in FIG. 2.

The bearing seat 30 is formed from a different material based on the designed strength requirement, such as metal material, and comprises a body 32 and a central tube 320 extending upwardly from the top surface of the body 32. A pair of blocks 324 is formed at the bottom of the body 32, corresponding to the cutouts 246 of the chassis 24 of the bracket 20. A flange 232 (shown in FIG. 5) is bent from each block 324 and is engagable in the slot 230. The combination of the recesses 248, the cutouts 246 and the blocks 324 acts as a second interlocking device to provide a detachable connection between the bearing seat 30 and the bracket 20.

Figure 6:
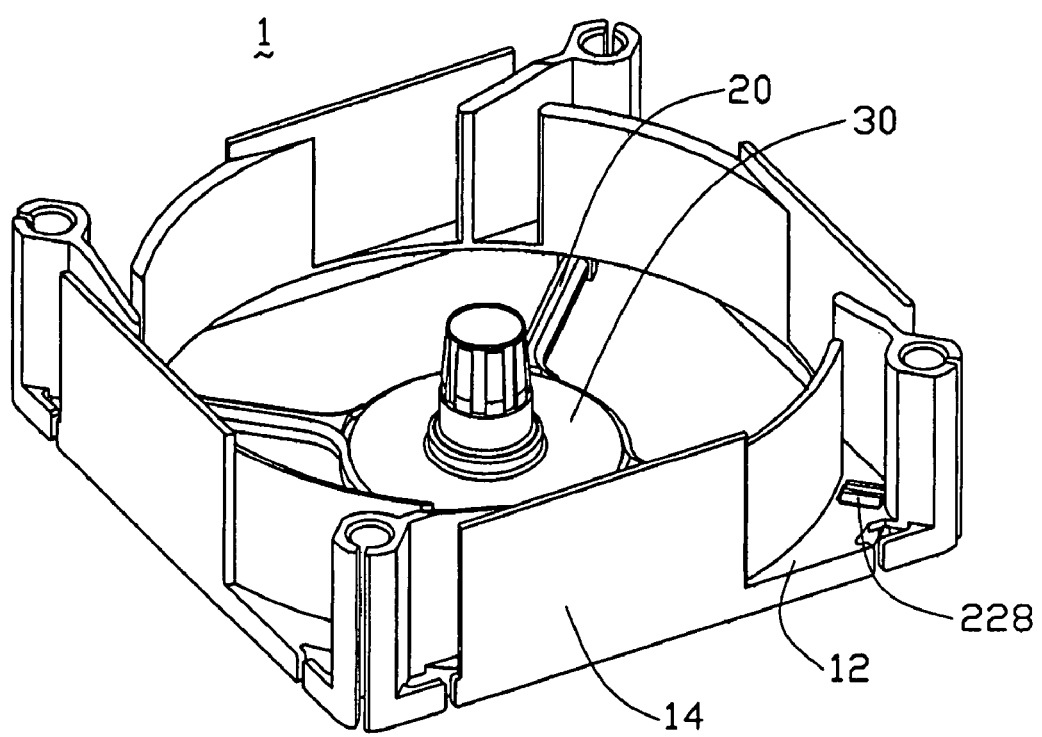
FIG. 6 is an assembled, isometric view of FIG. 1.
Figure 7:
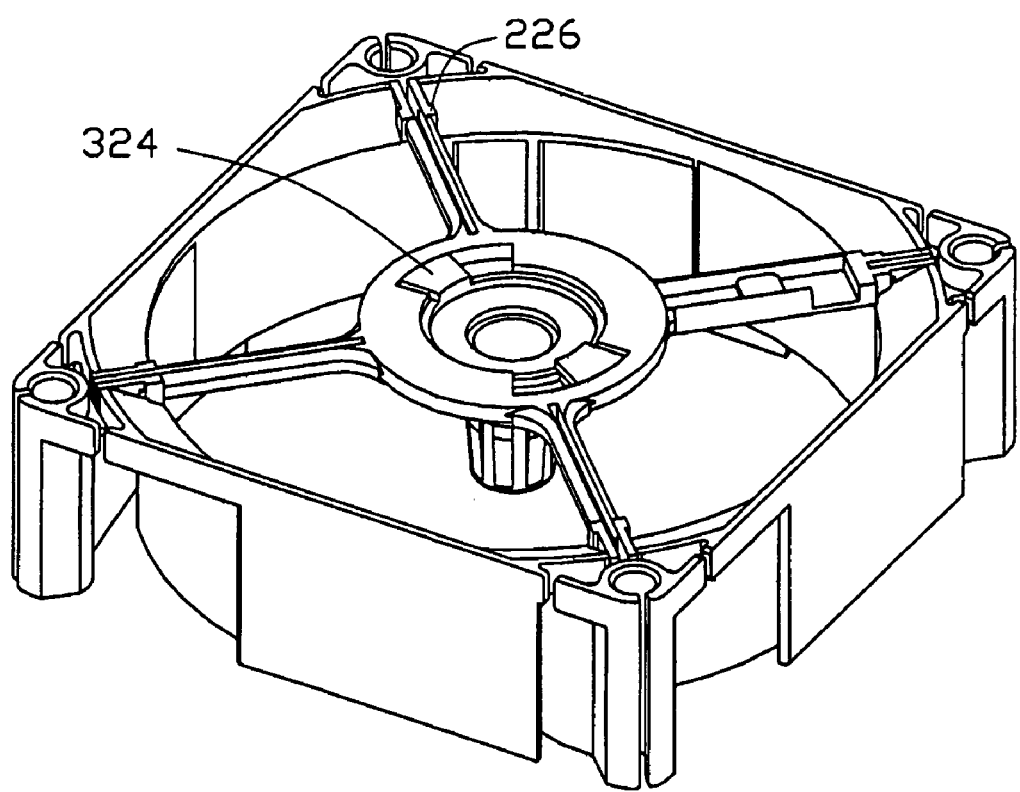
FIG. 7 is an assembled, isometric view of FIG. 2.

Referring to FIGS. 6–7, in assembly, the bracket 20 is placed below the frame 10 and each nub 226 and each pair of hooks 228 of the bracket 20 are received in the corresponding chambers 123 and the apertures 122 of the frame 10. The bracket 20 is pressed toward the frame 10. The pair of hooks 228 is pressed into the aperture 122. After traveling through the aperture 122, the pair of hooks 228 resumes their original state. The end portions of the hooks 228 engage with the top surface of the base 12. Simultaneously, each nub 226 is received in the corresponding chamber 123 and abuts against the corresponding pair of stop walls 124. The bracket 20 is thus fixedly attached to the frame 10 by the first interlocking device. The bearing seat 30 is placed on the chassis 24 of the bracket 20 and the two blocks 324 thereof extend through the corresponding cutouts 246. Then, the bearing seat 30 is pushed to rotate in a clockwise direction viewed from FIG. 6 so that the blocks 324 thereof are received in the corresponding recesses 248 to position the bearing seat 30 on the bracket 20 in the vertical direction and the flanges 232 of the blocks 324 engage in the slots 230 of the chassis 24 to position 30 on the bracket 20 in the horizontal direction. Thus, the fan guard 1 assembled. Alternatively, the bearing seat 30 is firstly mounted on the chassis 24 of the bracket 20. Then, the bracket 20 with the bearing seat 30 is detachably attached to the frame 10.

When one of the parts of the fan guard 1 need to be replaced or repaired, the bearing seat 30 is pushed to rotate in an anti-clockwise direction viewed from up to down of FIG. 6 to cause the flanges 230 to disengage from the slots 230. The bearing seat 30 is released from the bracket 20 when the two blocks 324 move away from the recesses 248 into the cutouts 246. The hooks 228 of the bracket 20 are squeezed to disengage from the apertures 122 of the frame 10, thereby separating the bracket 20 from the frame 10. Alternatively, the bracket 20 with the bearing seat 30 is firstly detached from the frame 10. Then the bearing seat 30 is separated from the chassis 24 of the bracket 20.

In the fan guard 1 described above, the aperture 122 and the chamber 123 of the first interlocking device are defined in the frame 10, and the lock portion 224 of the first interlocking device is formed on the bracket 20. It should be understood that the aperture 122 and the chamber 123 is alternatively defined in the bracket 20, and the lock portion 224 is formed on the frame 10. Alternatively, the recess 248 of the second interlocking device is defined in the bearing seat 30, and the block 324 is formed on the bracket 20.

The frame 10, the bracket 20 and the bearing seat 30 are made independently. They can be designed independently and are made of different material. Alternatively, the bracket 20 and the bearing seat 30 are integrally molded and the frame 10 is detachably attached to the bracket 20 with the bearing seat 30. It should be understood that the bracket 20 and the frame 10 is alternatively integrally molded and the independent bearing seat 30 is detachably attached to the bracket 20 with the frame 10.

It is understood that the invention may be embodied in other forms without departing from the spirit thereof. The above-described examples and embodiments are to be considered in all respects as illustrative and not restrictive, and the invention is not to be limited to the details given above.

What is claimed is:

1. A fan guard comprising:
   a frame comprising a base defining an opening and a plurality of sidewalls protruding from the base;
   a bracket located in the opening and connected with the frame;
   a bearing seat seated on the bracket; and
   a detachable interlocking device being formed between at least one of the combinations of the frame and the bracket, and of the bracket and the bearing seat;
   wherein the interlocking device comprises a plurality of first units formed on the bracket, and a plurality of second units formed on at least one of the frame and the bearing seat and interlocked with the first units.

2. The fan guard described in claim 1, wherein the interlocking device is formed between the frame and the bracket.

3. The fan guard described in claim 2, wherein each of the second units is a receiving portion comprising an aperture and a chamber and each of the first units is a lock portion engaged in the receiving pardon.

4. The fan guard described in claim 3, wherein the bracket comprises a chassis and a plurality of ribs extending from the chassis, the aperture and the chamber are defined in the base of the frame, and the lock portion is formed at the end of one of the ribs.

5. The fan guard described in claim 4, wherein the lock portion comprises a pair of hooks engaging in the aperture elastically.

6. The fan guard described in claim 5, wherein the lock portion further comprises a nub being received in the chamber, and a stop wall abutting against the nub is formed on the base of the frame on opposite sides of the aperture.

7. The fan guard described in claim 1, wherein the interlocking device is formed between the bracket and the bearing seat.

8. The fan guard described in claim 7, wherein each of the first units is a receiving portion comprising a recess and a cutout communicating with the recess and each of the second units is a block being extendable through the cutout to engage in the recess thereby detachably mounting the bearing seat to the bracket.

9. The fan guard described in claim 8, wherein a slot is defined in the recess, and a flange is bent from the block and is engagable in the slot to prevent the block from moving away from the recess to the cutout.

10. The fan guard described in claim 8, wherein the bracket comprises a chassis, and the recess is defined in the chassis, and the bearing seat comprises a body and a tube extending from the body, and the block is formed on the body opposing the tube.

11. A fan guard comprising:
    a frame comprising a base;
    a bracket comprising a chassis and a plurality of ribs extending from the chassis to detachably connect with the frame; and
    a bearing seat comprising a body and a central tube extending upwardly from the top surface of the body, the body being detachably attached to the bracket;
    wherein a first interlocking device is formed between the frame and the bracket, and a second interlocking device is formed between the bracket and the bearing seat.

12. The fan guard described in claim 11, wherein the first interlocking device comprises an aperture, a chamber and a lock portion engaging in the aperture and the chamber.

13. The fan guard described in claim 12, wherein the aperture and the chamber are defined in the base of the frame, and the lock portion is formed at the end of one of the ribs.

14. The fan guard described in claim 13, wherein the lock portion comprises a pair of hooks engaging in the aperture elastically and a nub being received in the chamber, and a pair of stop walls abutting against the nubs is formed on the base of the frame between the aperture and the chamber.

15. The fan guard described in claim 11, wherein the second interlocking device comprises a recess defined in the chassis of the bracket, a cutout communicating with the recess and a block formed on the body and engaged in the recess.

16. The fan guard described in claim 11, wherein a slot is defined below the recess, and a flange is bent from the block and is engagable in the slot to prevent the block from moving away from the recess to the cutout.

17. A fan guard of a fan comprising:
    a frame defining a space to allow other parts of said fan installed therein;
    a bracket located next to said space and detachably attached to said frame; and
    a part complementary installer used to install at least one of said other parts of said fan, said part complementary installer located in said space and attached to said bracket.

18. The fan guard described in claim 17, wherein said part complementary installer is used to receive a bearing of said fan and located at a center of said space.

19. The fan guard described in claim 17, wherein said part complementary installer is detachably attached to said bracket and material of said part complementary installer is different from material of said bracket.

* * * * *